US006887391B1

(12) United States Patent
Daneman et al.

(10) Patent No.: US 6,887,391 B1
(45) Date of Patent: May 3, 2005

(54) FABRICATION AND CONTROLLED RELEASE OF STRUCTURES USING ETCH-STOP TRENCHES

(75) Inventors: Michael J. Daneman, Pacifica, CA (US); Behrang Behin, Berkeley, CA (US)

(73) Assignee: Analog Devices, Inc., Norwood, MA (US)

( * ) Notice: Subject to any disclaimer, the term of this patent is extended or adjusted under 35 U.S.C. 154(b) by 361 days.

(21) Appl. No.: 09/712,420

(22) Filed: Nov. 13, 2000

Related U.S. Application Data

(60) Provisional application No. 60/192,144, filed on Mar. 24, 2000.

(51) Int. Cl.[7] ............................. C23F 1/00; H01L 21/311
(52) U.S. Cl. ............................................. 216/2; 438/700
(58) Field of Search ...................... 216/2, 11; 438/424, 438/412, 739, 740

(56) References Cited

U.S. PATENT DOCUMENTS

| | | | |
|---|---|---|---|
| 5,043,043 A | | 8/1991 | Howe et al. ................... 21/306 |
| 5,084,419 A | * | 1/1992 | Sakao .......................... 438/400 |
| 5,206,983 A | | 5/1993 | Guckel et al. ................. 29/598 |

(Continued)

FOREIGN PATENT DOCUMENTS

| | | | |
|---|---|---|---|
| EP | 0605300 | 7/1994 | ........... G01P/15/08 |
| EP | 0942462 | 9/1999 | ......... H01L/21/311 |
| EP | 1033601 | 6/2000 | ........... G02B/26/02 |
| GB | 2321780 | 8/1998 | ........... H01L/37/02 |

OTHER PUBLICATIONS

S. Wolf, "Silicon Processing for the VLSI Era", vol. 4, pp. 14–15, Lattice Press, 2002.*

Yao et al., "Single–Crystal Silicon Supported Thin Film Micro Mirrors for Optical Applications" Opt. Eng. 36(5) 1408–1413 (May 1997).

Conant et al. "A Flat High Frequency Scanning Micromirror" Abstract Submitted to Hilton Head 2000.

Storment et al. "Flexible Dry Release Process for Aluminum Electrostatic Actuators" Journal of Microelectromechanical System vol. 3 No. 3 Sep. 1994.

Mita et al., "An Out–of–Plane Polysilicon Actuator With a Smooth Vertical Mirror for Optical Fiber Switch Application".

Marxer et al. "Vertical Mirrors Fabricated by Deep Reactive Ion Etching For Fiber–Optic Switching Applications" Journal of Microelectromechanical Systems, vol. 6 No. 3, Sep. 1997.

Fedder, G.K., "integrated microelectromechanical systems in conventional CMOS", Proceedings of 1997 IEEE International Symposium on Circuits and Systems. Circuits and Systems in the Information Age. ISCAS '97 (Cat. No. 97CH35987), pp. 2821–2824, vol. 4.

*Primary Examiner*—P. Hassanzadeh
*Assistant Examiner*—Roberts Culbert
(74) *Attorney, Agent, or Firm*—JDI Patent; Joshua D. Isenberg

(57) ABSTRACT

MEMS structures may be formed on a substrate by forming a series trenches filled with etch-stop material in the device layer, followed by an isotropic etch of the device material stopping on the etch-stop material. This approach provides a controlled release method where the exact timing of the isotropic release etch becomes non-critical. Further, using this method, structures with significant topology may be fabricated while keeping the wafer topology to a minimum during processing until the very end of the process. Using the method of this invention, features with large topology may be formed while keeping the wafer topology to a minimum until the very end of the process.

25 Claims, 4 Drawing Sheets

U.S. PATENT DOCUMENTS

| | | | |
|---|---|---|---|
| 5,314,572 A | 5/1994 | Core et al. | 156/643 |
| 5,327,033 A | 7/1994 | Guckel et al. | 310/40 |
| 5,426,070 A * | 6/1995 | Shaw et al. | 216/2 |
| 5,576,250 A | 11/1996 | Diem et al. | 437/228 |
| 5,637,539 A | 6/1997 | Hofmann et al. | 438/20 |
| 5,638,946 A | 6/1997 | Zavracky | 200/181 |
| 5,645,684 A | 7/1997 | Keller | 156/643.1 |
| 5,717,631 A | 2/1998 | Carley et al. | 365/174 |
| 5,747,353 A * | 5/1998 | Bashir et al. | 438/50 |
| 5,770,465 A * | 6/1998 | MacDonald et al. | 216/2 |
| 5,780,885 A | 7/1998 | Diem et al. | 257/254 |
| 5,866,281 A | 2/1999 | Guckel et al. | 430/22 |
| 5,908,719 A | 6/1999 | Guckel et al. | 430/5 |
| 5,914,507 A | 6/1999 | Polla et al. | 257/254 |
| 5,943,155 A | 8/1999 | Goossen | 359/247 |
| 5,949,571 A | 9/1999 | Goossen et al. | 359/291 |
| 5,971,355 A | 10/1999 | Biegelsen et al. | 251/129.06 |
| 6,021,675 A | 2/2000 | Sefeldt et al. | 73/777 |
| 6,025,951 A | 2/2000 | Swart et al. | 359/245 |
| 6,121,552 A * | 9/2000 | Brosnihan et al. | 174/253 |
| 6,203,715 B1 | 3/2001 | Kim et al. | 216/24 |
| 6,291,875 B1 * | 9/2001 | Clark et al. | 257/622 |

* cited by examiner

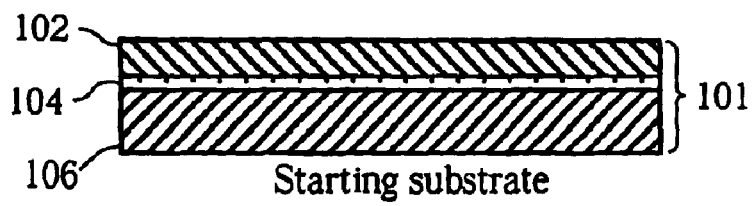
Fig. 1A — Starting substrate
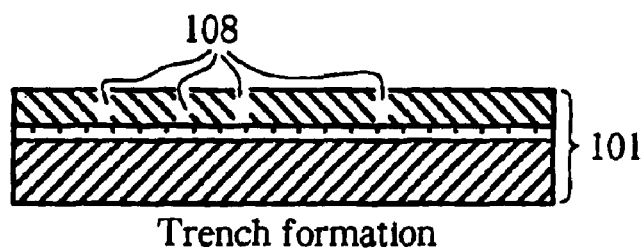
Fig. 1B — Trench formation
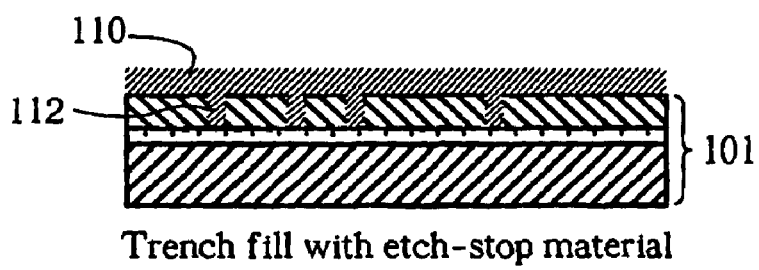
Fig. 1C — Trench fill with etch-stop material
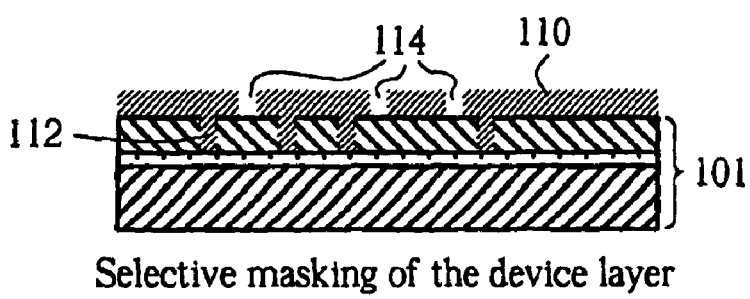
Fig. 1D — Selective masking of the device layer
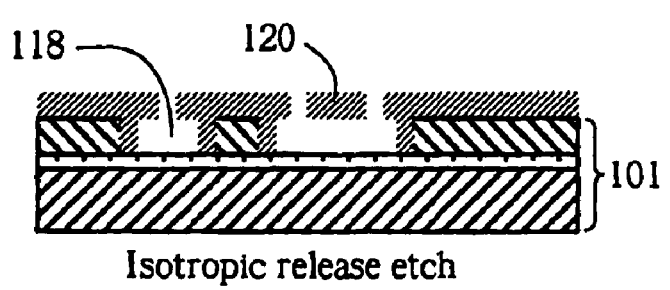
Fig. 1E — Isotropic release etch Starting substrate Trench formation Trench fill with etch-stop material Selective exposure of device layer material Formation of top comb fingers Isotropic release etch

FABRICATION AND CONTROLLED RELEASE OF STRUCTURES USING ETCH-STOP TRENCHES

CROSS REFERENCE TO RELATED APPLICATION

This application is based on Provisional application 60/192,144, filed Mar. 24, 2000, which is herein incorporated by reference.

FIELD OF THE INVENTION

This invention relates generally to microelectromechanical systems (MEMS). More particularly, it relates to forming structures on MEMS devices.

BACKGROUND

Large topology MEMS structures have applications for actuators, where the actuation force can be greatly increased by increasing the actuator area; optical devices, where high aspect ratios are needed to interact with optical beams, bio-MEMS, where high aspect ratio channels and sensors may be required; and a number of other applications where it is desirable to use a semiconductor compatible process to generate large topology structures.

A number of methods currently exist for forming large topology structures in MEMS processes, however, all have distinct disadvantages in process compatibility with following steps and/or in process complexity.

One common approach uses deep UV or X-ray lithography to define high aspect ratio features in photoresist or polymer and then electrodeposit metallic material inside the photoresist features. However, once the photoresist or polymer is removed, tall features are left on the wafer, preventing the use of standard resist and deposition processes for further processing. Also, the use of metallic materials to form the features prevents high temperature steps in further processing. Finally, this method requires the use of expensive X-ray lithography sources, which are not commonly used in semiconductor processing, for forming features.

Another method uses standard photoresist processing followed by a deep anisotropic etch (for example into the device layer of an SOI wafer) to form deep features. As in the previous method, this process leaves tall features on the wafer, preventing further standard processing. If the trenches formed by this process are narrow enough, they may be planarized by depositing a conformal film of sacrificial material, however, in this case the features are limited to having very small trenches (typically 2 $\mu$m or less in depth) significantly limiting the types of structures that may be defined.

SUMMARY

The disadvantages associated with the prior art are overcome by the present invention of methods for fabrication and controlled release of structures. The structures may be fabricated on a substrate by forming one or more trenches in a device layer. The trenches are subsequently lined or filled with an etch-stop material to form etch-stop trenches. Material in the device layer is then isotropically etched in selected portions bounded by one or more of the etch-stop trenches. The etching undercuts one or more portions of the etch-stop material that has been deposited over the surface of the device layer. The etch-stop material may be used to form structures that are released by the etch process. Alternatively, the structures may be formed by a different type of material deposited over the device layer and/or etch-stop material. This approach provides a controlled release method where the exact timing of the isotropic release etch becomes non-critical. Further, using this method, structures with significant topology may be fabricated while keeping the wafer topology to a minimum during processing until the very end of the process. The present invention also includes structures fabricated in accordance with the method outlined above. This embodiment of the invention is particularly suitable for comb drive structures, such as those used in MEMS devices.

DESCRIPTION OF THE FIGURES

FIGS. 1A–1E depict cross sectional schematic diagrams illustrating formation of a MEMS device according to a first embodiment of the invention;

DETAILED DESCRIPTION

Figure 2A:
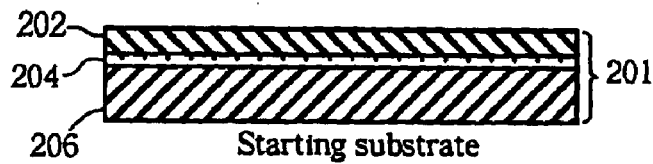
FIGS. 2A–2F depict cross sectional schematic diagrams illustrating formation of a MEMS device according to a second embodiment of the invention.
Figure 2B:
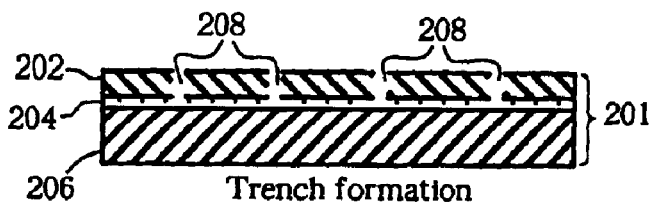
Figure 2C:
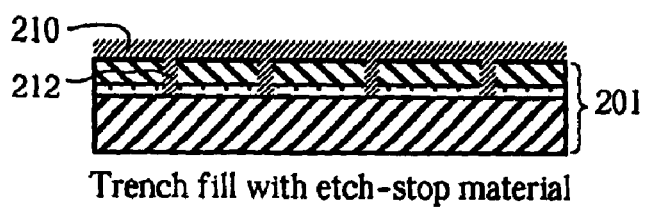

Although the following detailed description contains many specifics for the purposes of illustration, anyone of ordinary skill in the art will appreciate that many variations and alterations to the following details are within the scope of the invention. Accordingly, the following preferred embodiment of the invention is set forth without any loss of generality to, and without imposing limitations upon, the claimed invention.

A first exemplary embodiment of process is useful for forming high aspect ratio structures on a substrate and releasing structures formed on a substrate is shown in FIGS. 1A–1E. The structures are typically formed in a device layer 102. The device layer 102 may be the top layer of a silicon-on-insulator (SOI) substrate, the substrate itself, or a glass, quartz, or oxide layer deposited on top of a substrate. In this embodiment, the structures are formed on and released from an SOI substrate 101 depicted in FIG. 1A. The SOI substrate 101 generally comprises the device layer 102 disposed on an intermediate 104, which is disposed on a substrate layer 106. The device layer 102, intermediate layer 104, and substrate layer 106 may be made from semiconductor materials, e.g., Si, GaAs, etc., metals e.g., Al, Cu, Ti, W, Au, etc., or insulators, e.g. oxides. The device layer 102 and the substrate layer 106 may be made of the same material as each other. Generally, the intermediate layer 104 is made of a material that is different from that of the device and substrate layers. The material of the intermediate layer is preferably made from a material that is etchable by a process that does not attack the device layer 102 or the substrate layer 106.

As shown in FIG. 1B, narrow trenches 108 are formed in the device layer 102 by patterning a standard resist and etching the device layer. An etch stop material 110 is then deposited in selected trenches 108 to fill or line them as shown in FIG. 1C. Suitable etch-stop materials include silicon nitride, polycrystalline silicon, silicon dioxide, tungsten, etc. The etch-stop material is typically deposited using chemical vapor deposition. Alternatively, sputtering or electroplating may be used to deposit the etch-stop material 110. The etch-stop material lines or fills selected trenches, forming etch-stop trenches 112. The etch-stop material 110 may be also deposited over a surface of the device layer 102, which would typically happen in the same deposition step. Alternatively, a separate deposition may be required for this. At this point the surface of the device layer 102 is largely planar and any further processing may be performed using standard semiconductor processes. Also, since the etch-stop material may be deposited at high temperature, further high-temperature processing is not prevented.

Once all processing has been performed, a photoresist and/or etch-stop material 110 is patterned to expose selected portions 114 of the device layer 102, as shown in FIG. 1D. The patterning of the etch-stop material 110 defines one or more structures 120 bounded by one or more of the filled trenches 110. The etch-stop material 110 may be etched using standard semiconductor techniques, e.g., wet etch, plasma etch, etc. Although, the structures 120 are depicted as being entirely formed by the etch-stop material 110, the structures 120 may include other materials in addition to the etch-stop material 110. Next, an isotropic etch of device layer 102 is performed, as shown in FIG. 1E. During this step the material in the exposed portions 114 of the device layer 102 is etched, but the etch-stop material is not etched. In the embodiment depicted in FIGS. 1A–1E, the insulator 104 is also resistant to the isotropic etch process. Thus, the isotropic etch removes material from portions of the device layer 102 that are bounded by one or more etch-stop trenches 112 and the intermediate layer 104. The isotropic etch may be a wet etch process or dry etch process or some combination of both. The isotropic etch undercuts and releases structures 120 defined on top of the device layer by the patterning depicted in FIG. 1D. The structures 120 may be secured to the etch-stop material 110 or the device layer 120 at some point or points outside the plane of the drawing in FIG. 1E. The etch is contained by the etch-stop material 110 in the etch-stop trenches N2. Thus, the spacing of the filled trenches 112 controls the width of the undercut. At this point, the structures 120 are fully defined and the devices are ready for use or a final release, depending on the process.

In the process described above with respect to FIGS. 1A–1E, the structures 120 were formed from the etch-stop material. In an alternative embodiment, structures may be formed using a material different from the etch-stop material. An application of this process may be used, for example, to form comb structures for electrostatic actuators, capacitive sensors, or other applications. The process for fabricating such a structure is shown in FIGS. 2A–2F. In FIG. 2A, the process starts with a substrate 201 having a device layer 202 disposed on an intermediate layer 204, which is disposed on a substrate layer 206. The device layer 202 may alternatively be the substrate itself, or a layer of device material such as glass, quartz, or oxide deposited on top of a substrate. The device layer 202 is patterned to define one or more features, e.g. using a standard resist. The features are then etched to form one or more narrow trenches 208 in the device layer 202, as shown in FIG. 2A. The trenches 208 may penetrate into the oxide layer 204 and/or the substrate layer 206. The trenches 208 are then lined or filled with an etch-stop material 210 as described with respect to FIG. 1C, to form one or more etch-stop trenches 212. The etch-stop material may also be deposited on top of the device layer 202.

Figure 2D:
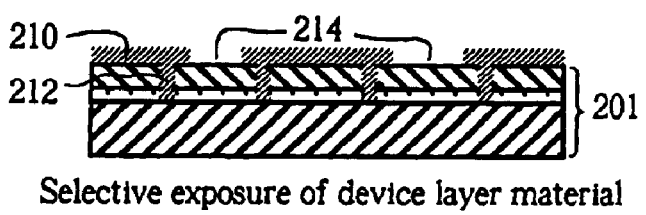
Figure 2E:
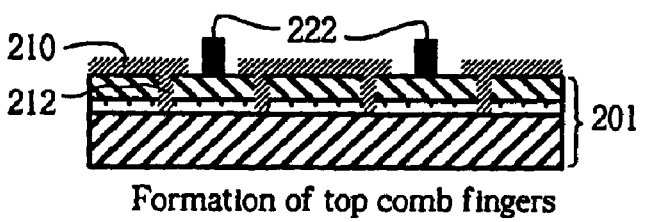
Figure 2F:
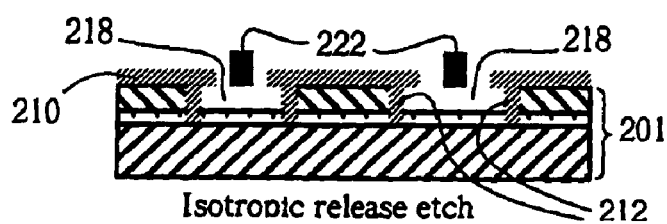

Selected portions of the etch-stop material 210 are removed to expose selected portions of the device layer 202, as shown in FIG. 2D. Structural features 222, such as comb fingers, are then formed on the exposed portions of the device layer 202. Alternatively, the structural features 222 may be formed directly on top of the etch-stop material 210 as opposed to the device layer 202. The structural features 222 are typically made of a material that is different from the etch-stop material 210. Alternatively, the features 222 may be formed from the same material, but in a later deposition step. The structural features 222 may be formed from a patterned structural layer containing multiple sub-layers of material. The structural features 222 are secured to the structural layer 202 at some point or points outside the plane of the drawing in FIGS. 2E–2F. Once all processing of the structural features 222 has been performed, the photoresist and/or the etch-stop layer is patterned to expose the device layer in appropriate places as shown in FIG. 2E. Next, an isotropic etch of the device layer is performed as shown in FIG. 2F. During this step the exposed device layer material will be etched, undercutting and releasing the structures on top of the device layer as described above with respect to FIG. 3E. The etch is contained by the etch-stop material 210 in the etch-stop trenches 112, controlling the width of the undercut. At this point, the structures are fully defined and the devices are ready for use or a final release, depending on the process.

Figure 3A:
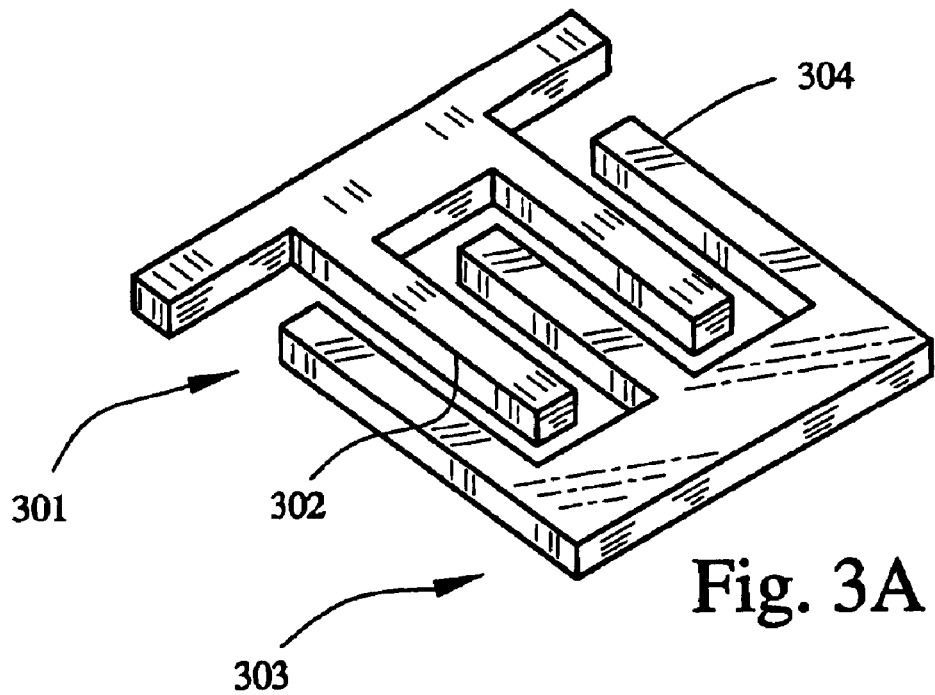
FIG. 3A depicts an isometric view of a comb structure manufactured according to a third embodiment of the invention.

The above methods may be used to fabricate different types of structures. Such structures may have greater topology, i.e., greater heights above the device layer, than in the prior art. For example, FIG. 3A depicts an embodiment of a comb structure manufactured according to the present invention. The comb structure 300 generally comprises a static comb member 301 having one or more comb fingers 302 and a movable comb member 303 having one or more comb fingers 304. The fingers 302, 304 of the fixed and movable comb members 301, 303 interdigitate. Such a structure is useful in a comb-drive actuator device. In one example of such an actuator, an electric field between the fixed and movable comb fingers 302, 304 causes the movable fingers 302 to deflect in response to an electrostatic force.

Figure 3B:
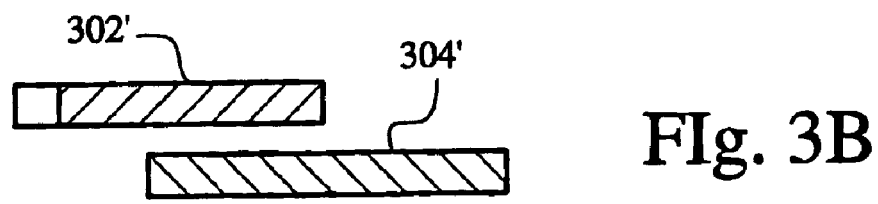
FIGS. 3B–3C depict cross sectional side views of alternative embodiments of comb structures manufactured according to the present invention.
Figure 3C:
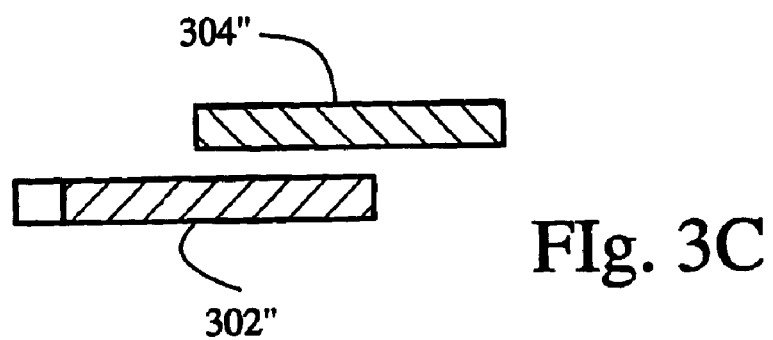

Although the fixed and movable comb fingers 302, 304 are depicted as being at substantially the same level, other arrangements are possible. For example, in the side cross sectional view depicted in FIG. 3B movable comb fingers 302' are disposed above static comb fingers 304'. In such a case a voltage between the static comb fingers 304' and the movable comb fingers 302' would produce an electric force that would cause the movable comb fingers 302' to deflect downward. Alternatively, as depicted in the side cross sectional view in FIG. 3C movable comb fingers 302" are disposed below static comb fingers 304". In such a case a voltage between the static comb fingers 304" and the movable comb fingers 302" would produce an electric force that would cause the movable comb fingers 302" to deflect upward.

Figure 4A:
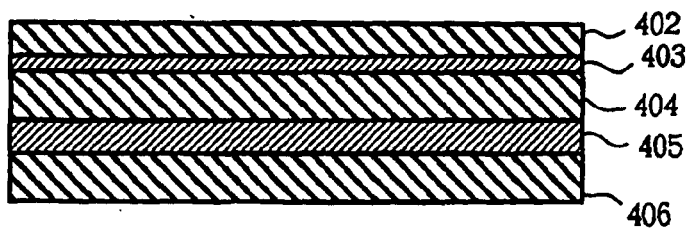
FIGS. 4A–4F depict cross-sectional schematic diagrams illustrating formation of a MEMS device according to an alternative embodiment of the present invention.
Figure 4B:
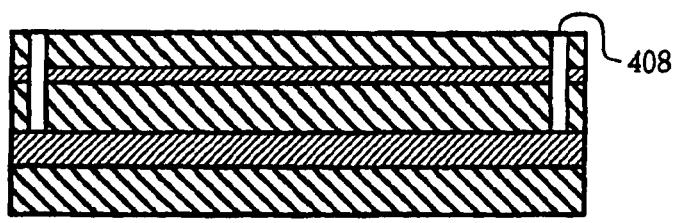
Figure 4C:
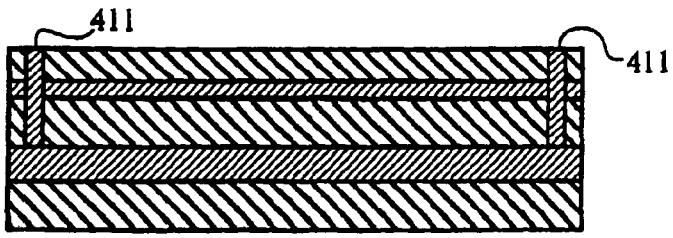
Figure 4D:
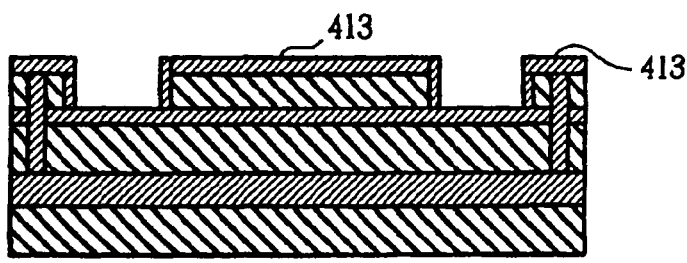
Figure 4E:
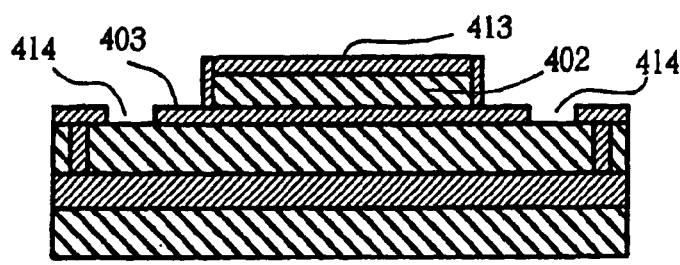
Figure 4F:
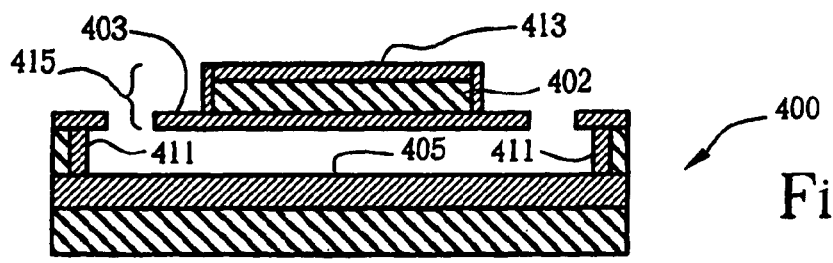

It will be clear to one skilled in the art that the above embodiments may be altered in many ways without departing from the scope of the invention. For example, the structural features may be formed from portions of a device layer that are protected from etching by adjacent etch-stop layers. By way of example, FIGS. 4A–4F depict the fabrication of a MEMS structure using a starting material 401 having a substrate layer, two device layers and two etch stop layers. In FIG. 4A, the process starts with a material 401 having upper and lower device layers 402, 404, disposed on a substrate 406. A first etch-stop layer 403 is disposed between the upper and lower device layers 402, 404. A second etch-stop layer 403 is disposed between the lower device layer 404 and the substrate 406. The device layers 402, 404 may be layers of material such as silicon, glass, or quartz bonded or deposited on top of a substrate. The etch-stop layers 403 and 405 may include silicon oxide, silicon, or other applicable material. An example of material 401 would be a two-layer silicon-on-insulator (SOI) material. The material 401 may be patterned and etched to form one or more narrow trenches 408 in the device layers 402, 404 and the first etch-stop layer 403 as shown in FIG. 4B. The trenches 408 may optionally penetrate into the etch-stop layer 405 and/or the substrate 406. The trenches 408 are then filled or lined with an etch-stop material to form one or more etch-stop trenches 411 as shown in FIG. 4C. Selected portions of the upper device layer 402 are then etched to a stopping point, e.g., on the etch-stop layer 403 or device layer 404. A layer of etch-stop material 413 is then deposited over the remaining portions of the upper device layer 402 and, optionally, also over lower device layer 404 as shown in FIG. 4D. Vias 414 are then etched in the first etch stop layer 403 as shown in FIG. 4E. The vias 414 allow the etching of the lower device layer 404 to release a structure 415 formed by a portion of the upper device layer 402 that is bounded by the etch stop layers 403 and 413 as shown in FIG. 4F. Specifically, the etch stop layers 403, 413 may protect the structure 415 during an isotropic etch process that removes a portion of the lower device layer 404 bounded by the first and second etch stop layers 403, 405 and the etch-stop trenches 411 to release the structure 415. Accordingly, the scope of the invention should be determined by the following claims and their legal equivalents.

What is claimed is:

1. A method for a controlled release of structures comprising:
    a) forming one or more trenches in a layer of device material;
    b) filling one or more selected trenches with an etch-stop material to form one or more etch-stop trenches;
    c) defining one or more structures between the selected trenches;
    d) forming a structural layer proximate one or more exposed areas of the device layer, wherein the structural layer includes one or more structures that are formed directly on top of an etch-stop layer; and
    e) etching one or more portions of the device layer between the etch-stop trenches to release the structures, wherein the etching does not etch the etch-stop material.

2. The method of claim 1, wherein b) includes depositing etch-stop material over the surface of the device layer.

3. The method of claim 2 wherein c) includes forming one or more openings in the etch-stop material that has been deposited over the surface of the device layer.

4. The method of claim 2, wherein the etching undercuts one or more portions of the etch-stop material that has been deposited over the surface of the device layer.

5. The method of claim 1 where the layer of device material is disposed between two layers of etch-stop material.

6. The method of claim 1, wherein the device layer includes one or more layers of a silicon-on-insulator (SOI) substrate.

7. The method of claim 1, wherein the device layer is a layer of glass, quartz or oxide.

8. The method of claim 1, wherein e includes a wet etch process.

9. The method of claim 1, wherein e includes a dry etch process.

10. The method of claim 1, wherein the etch process in e does not etch the structural layer.

11. The method of claim 1, further comprising releasing one or more portions of the structural layer.

12. The method of claim 1, wherein the etch process in e releases one or more portions of the structural layer.

13. The method of claim 1, wherein the structural layer contains two or more sub-layers.

14. A process for forming structures comprising:
    i) forming one or more trenches in a layer of device material;
    ii) filling one or more selected trenches with an etch-stop material to form one or more etch-stop trenches;
    iii) masking a surface of the layer of device material to expose one or more selected areas of device material that border one or more of the etch-stop trenches; and
    iv) forming one or more structures on one or more of the selected areas of the device material that were exposed; and
    v) etching one or more of the selected areas of the device layer to release the structures, wherein the etching does not etch the etch-stop material.

15. The method of claim 1, wherein the structural layer is protected by one or more etch-stop layers.

16. The method of claim 14, wherein one or more of the structures include a device layer protected by one or more etch-stop layers.

17. The method of claim 14, wherein filling one or more selected trenches with an etch-stop material includes depositing etch-stop material over the surface of the device layer.

18. The method of claim 17 wherein masking a surface of the layer of device material includes forming one or more openings in the etch-stop material that has been deposited over the surface of the device layer.

19. The method of claim 17, wherein the etching one or more of the selected areas of the device layer undercuts one or more portions of the etch-stop material that has been deposited over the surface of the device layer.

20. The method of claim 14, where the layer of device material is disposed between two layers of etch-stop material.

21. The method of claim 14, wherein the device material includes one or more layers of a silicon-on-insulator (SOI) substrate.

22. The method of claim 14, wherein the device material includes glass, quartz or oxide.

23. The method of claim 14, wherein etching one or more of the selected areas of the device layer includes a dry etch or wet etch process.

24. The method of claim 14, wherein etching one or more of the selected areas of the device layer does not etch the structures.

25. The method of claim 24, wherein the structures include two or more sub-layers.

* * * * *